United States Patent [19]

Endo et al.

[11] Patent Number: 5,418,005
[45] Date of Patent: May 23, 1995

[54] METHOD FOR RECLAIMING PIGMENT-ATTACHED RED-EMITTING PHOSPHOR

[75] Inventors: Hideo Endo, Minamiashigara; Shinsuke Aoki, Odawara; Chihiro Yoshida, Hadano, all of Japan

[73] Assignee: Kasei Optonix, Ltd., Tokyo, Japan

[21] Appl. No.: 125,765

[22] Filed: Sep. 24, 1993

[30] Foreign Application Priority Data

Sep. 24, 1992 [JP] Japan ................... 4-254267

[51] Int. Cl.$^6$ .................. B32B 35/00; B05D 5/06
[52] U.S. Cl. ................... 427/140; 427/64; 427/68; 427/71; 427/345
[58] Field of Search ............ 427/140, 64, 68, 71, 427/345

[56] References Cited

U.S. PATENT DOCUMENTS

| | | | |
|---|---|---|---|
| 4,213,894 | 5/1993 | Kim | 427/71 |
| 4,517,224 | 5/1985 | Ditty | 427/64 |

FOREIGN PATENT DOCUMENTS 0340086 11/1989 European Pat. Off. .
0453685 10/1991 European Pat. Off. .

*Primary Examiner*—Janyce Bell
*Attorney, Agent, or Firm*—Oblon, Spivak, McClelland, Maier, & Neustadt

[57] ABSTRACT

A method for reclaiming a pigment-attached red-emitting phosphor recovered from a manufacturing process for a color picture tube, which comprises treating the phosphor with an aqueous solution containing NaOH, NaClO and $H_2O_2$ and then treating it with a weak acid, whereby the pigment can be prevented from exfoliation by suppressing the dissolution of the binder which attaches the pigment to the phosphor, and blue- and green-emitting phosphors contained as contaminants in the recovered red-emitting phosphor can be completely removed. The method provides a reclaimed red-emitted phosphor with high luminance and a good coating property.

6 Claims, No Drawings

METHOD FOR RECLAIMING PIGMENT-ATTACHED RED-EMITTING PHOSPHOR

The present invention relates to a method for reclaiming a pigment-attached red-emitting phosphor recovered from a manufacturing process for a color picture tube, such as a red iron oxide-attached europium-activated yttrium oxysulfide or a red iron oxide-attached europium-activated yttrium oxide.

A fluorescent layer of a color picture tube is formed in such a manner that each of green-, blue- and red-emitting phosphors is mixed with predetermined proportions of polyvinyl alcohol, ammonium dichromate, a surfactant, etc. to obtain a phosphor slurry, which is then coated over the entire surface of a face plate having a black matrix preformed by carbon, by a suitable coating method such as a spin coating method, then ultraviolet rays are irradiated through a shadow mask or an aperture grille to cure the predetermined portions, followed by developing with warm water. This operation is repeated with respect to three color-emitting phosphors to form a fluorescent layer with a predetermined arrangement of dots or stripes.

Phosphor slurries dripped or shaked off from the face plate in the above coating step and phosphors washed off by water in the developing step are recovered. Among such recovered phosphors, a red-emitting phosphor containing expensive rare earth elements, will certainly be reclaimed and reused.

The red-emitting phosphor slurry recovered in the coating step contains blue- and green-emitting phosphors as contaminants in addition to polyvinyl alcohol and ammonium dichromate as constituting components of the phosphor slurry. The red-emitting phosphor slurry recovered in the developing step is the one which is obtained by washing non-exposed portions with developing water and thus contains substantial amounts of other color emitting phosphors.

Such recovered red-emitting phosphor will be purified for reuse, by removing impurities. Among the impurities, organic substances may be removed by treatment with an oxidizing agent, alkali treatment or pyrolytic treatment (400° to 450° C.), and a blue-emitting phosphor contaminant such as ZnS:Ag and a green-emitting phosphor contaminant such as ZnS:Cu,Al may be removed by dissolving them with sodium hypochlorite or a mineral acid (such as HCl, $H_2SO_4$ and $HNO_3$).

However, when treated with a mineral acid, yttrium oxysulfide as a host material of the red-emitting phosphor will be partially dissolved to generate hydrogen sulfide. This hydrogen sulfide will react with heavy metal ions such as copper ions or silver ions which may be present in the system, to form hardly soluble CuS, AgS, etc., which will firmly adhere to the phosphor surface. Such adherence impairs the phosphor surface property and adversely affects the emitting property and the coating property. Further, the dissolution of the host material causes exfoliation of the pigment attached to the phosphor. Accordingly, it is required to reattach the pigment to the phosphor before reuse. This adds to the manufacturing cost. The use of a strong acid necessitates washing with water repeatedly and thus requires a long time for treatment and extra cost for equipment.

In the treatment with an alkali or with an oxidizing agent, a strong alkali or a large amount of an oxidizing agent is required, to completely remove blue- and green-emitting phosphors. Besides, under such a treating condition, the phosphor will be oxidized, whereby the luminance will be reduced. Further, most of the pigment will be exfoliated by the exfoliation of binder, and it will be necessary to reattach pigment before reuse.

It is an object of the present invention to overcome the above drawbacks and to provide a treating method for reclaiming a pigment-attached red-emitting phosphor, whereby not only blue- and green-emitting phosphors can be completely removed while preventing the pigment from exfoliation by suppressing dissolution of the binder which attaches the pigment to the phosphor, but also deterioration of the luminance and the coating property, can be prevented.

The present invention provides a method for reclaiming a pigment-attached red-emitting phosphor recovered from a manufacturing process for a color picture tube, which comprises treating the phosphor with an aqueous solution containing NaOH, NaClO and $H_2O_2$ and subsequently treating it with a weak acid.

Now, the present invention will be described in detail with reference to the preferred embodiments.

The red-emitting phosphor suitable for the treating method of the present invention is a Eu-activated $Y_2O_2S$ phosphor or a Eu-activated $Y_2O_3$ phosphor, to which a red pigment such as red ion oxide is attached by means of a synthetic rubber such as an acrylic resin and a SBR resin. Such a phosphor may be covered with silica. To prepare a color picture tube, a red-emitting phosphor is used together with a Ag,Cl-activated ZnS blue-emitting phosphor, a Cu,Al-activated ZnS green-emitting phosphor and a Cu,Au,Al-activated ZnS green-emitting phosphor, or together with such blue- and green-emitting phosphors having pigments attached thereto. Accordingly, the recovered red-emitting phosphor slurry contains such blue- and green-emitting phosphors as contaminants.

The treating solution to be used in the method of the present invention, is adjusted preferably to contain NaOH at a concentration of from 0.3 to 4.0% by weight, NaClO at a concentration of from 1.0 to 5.0% by weight and $H_2O_2$ at a concentration of from 0.5 to 3.0% by weight, based on the solid content of the phosphor slurry.

If the concentrations exceed these ranges, the oxidizing effect of the treating solution will be so strong that the luminance and the coating property of the phosphor will be deteriorated. On the other hand, if the concentrations are below the ranges, it is likely that the blue- and green-emitting phosphors, polyvinyl alcohol, etc. can not be removed to a practical level. The treatment is conducted preferably at a temperature of at least 70° C.

In the weak acid treatment, dilute sulfuric acid, dilute hydrochloric acid, acetic acid or the like may be used. It is preferable that such a weak acid is added to the phosphor slurry so that the pH of the slurry is adjusted to from 2 to 3, and the slurry is stirred and then washed with water repeatedly until the pH becomes at least 4.

The present invention is directed to a method which comprises treating a red pigment-attached phosphor recovered from a manufacturing process for a color picture tube, with an aqueous solution containing NaOH, NaClO and $H_2O_2$, and subsequently removing the oxide produced by such an oxidizing agent with a weak acid, and thus designed to completely remove blue- and green-emitting phosphors contained as contaminants in the recovered red-emitting phosphor slurry, while preventing the pigment from exfoliation by suppressing the dissolution of the binder which attaches the pigment to the phosphor. The method of the present invention is effective for preventing deterioration of the luminance and the coating property of the red-emitting phosphor.

The surface of the reclaimed phosphor is preferably treated with gelatin, gum arabic and coating agent $ZnSO_4$, to improve the property of the slurry of the reclaimed phosphor.

A fresh red-emitting phosphor is added to the reclaimed red-emitting phosphor usually in a proportion of the fresh phosphor/the reclaimed phosphor of from 20/80 to 50/50 for reuse.

Now, the present invention will be described in further detail with reference to Examples. However, it should be understood that the present invention is by no means restricted to such specific Examples.

Example for the preparation of pigment-attached red-emitting phosphor 600 l of pure water was added to a slurry containing 300 kg of a Eu-activated $Y_2O_2S$ phosphor, and 480 g of red iron oxide was added thereto with stirring. A solution having 180 g of gelatin and 180 g of gum arabic dissolved in warm water, and 120 g of a SBR resin (as solid content) were added thereto and stirred for 20 minutes. After adjusting the pH to 4.2 by acetic acid and stirring for 30 minutes, 1.5 l of a glutaraldehyde curing agent was added and the resulting slurry was stirred for 60 minutes and left to stand still overnight.

Then, coating agent $ZnSO_4$ was added thereto, the pH of the slurry was adjusted and the slurry was stirred for 20 minutes.

The resulting slurry was dehydrated, dried and worked up by sieving to obtain a red iron oxide-attached Eu-activated $Y_2O_2S$ phosphor.

Example for the manufacture of cathode-ray tubes

To an aqueous solution of polyvinyl alcohol, the above red iron oxide-attached Eu-activated $Y_2O_2S$ phosphor, a dispersant, an anti-foaming agent, etc. were added in a conventional manner and thoroughly stirred, and ammonium dichromate sensitizer was added thereto obtain a red-emitting phosphor slurry.

Separately, blue- and green-emitting phosphor slurries were prepared in the same manner as for the red-emitting phosphor slurry, by using a Ag,Cl-activated ZnS phosphor as a blue-emitting phosphor and a Cu,Al-activated ZnS phosphor as a green-emitting phosphor. Then, a glass panel was coated with green-, blue- and red-emitting phosphor slurries successively, followed by drying, exposure and development to obtain a color cathode-ray tube.

Example for reclaiming treatment of the recovered red-emitting phosphor

The red-emitting phosphor recovered in the developing step was subjected to reclaiming treatment under the following conditions.

Sample F 300 kg, based on dry weight, of the recovered phosphor was added to 300 l of pure water, and the mixture was stirred for 30 minutes, followed by sieving to remove foreign substances. Subsequently, warm water was added to the resulting slurry to the total volume of 1,000 l. After adjusting the temperature of the mixture to 75° C., the slurry was stirred for 20 minutes and left to stand still, and then, the supernatant was discarded. Warm water was added again to the obtained precipitate to the total volume of 700 l, and the temperature was adjusted to 75° C. While stirring, a treating solution comprising 1.5 kg of NaOH as an alkali, 60 l of 12.5% NaClO (based on effective chlorine) as an oxidizing agent and 8 l of 35% $H_2O_2$, was gradually added to the above slurry and the slurry mixture was stirred for 3 hours and left to stand still to precipitate the phosphor, and the supernatant was discarded to remove polyvinyl alcohol, ammonium dichromate, etc. Warm water was further added to the phosphor slurry to the total volume of 1,000 l. The resulting slurry was stirred for 20 minutes with the temperature adjusted to 75° C. and left to stand still, and the supernatant was discarded.

To the above phosphor slurry, water was added to the total volume of 700 l, and 4 l sulfuric acid was added to the phosphor slurry while stirring and maintaining the temperature at 25° C., to adjust the pH to 2.5. After stirring for 2.5 hours, the resulting slurry was left to stand still, and the supernatant was discarded, followed by washing with water repeatedly so that the pH would be about 4.

To the phosphor slurry thus reclaimed, water was added to the total volume of 700 l, and the solution having 180 l of gelatin and 180 l of gum arabic dissolved in warm water, was added thereto. After stirring for 20 minutes, the phosphor slurry was left to stand still, and the supernatant was discarded. After further adding water to the slurry to bring the total volume to 700 l, coating agent $ZnSO_4$ was added, and the slurry was stirred for 20 minutes, dehydrated, dried and sieved, to treat the surface of the phosphor.

Sample A

In the reclaiming treatment of Sample F, only the initial washing treatment was conducted, and the treatment with the treating solution and subsequent treatments were omitted, to obtain a reclaimed phosphor, which is designated as Sample A.

Sample B

A slurry of a fresh red-emitting phosphor was prepared and used as a standard for the evaluation of reclaimed phosphor slurries.

Sample C

In the reclaiming treatment of Sample F, the recovered phosphor was treated in the same manner as for Sample F, except for omitting 3% NaClO from the treating solution comprising 0.5% NaOH, 3% NaClO and 1.4% $H_2O_2$, to obtain a reclaimed phosphor, which is designated as Sample C.

Sample D

In the above reclaiming treatment of Sample C, the recovered phosphor was treated in the same manner as for Sample C, except that the concentration of $H_2O_2$ of the treating solution was 14%, to obtain a reclaimed phosphor, which is designated as Sample D.

Sample E

In the above reclaiming treatment of Sample F, the recovered phosphor was treated in the same manner as for Sample F, except that $H_2O_2$ was excluded from the treating solution comprising 0.5% NaOH, 3% NaClO and 1.4% $H_2O_2$, to obtain a reclaimed phosphor, which is designated as Sample E.

Evaluation of the reclaimed red-emitting phosphors

Phosphor slurries of Samples A to F, were evaluated with respect to the items shown in Table 1. Sample F represents the phosphor reclaimed according to the method of the present invention.

① The luminance shown in Table 1 is a relative luminance based on the luminance of the fresh standard phosphor being evaluated to be 100%.

② The powder reflectance of the phosphors was measured at a wavelength of 500 mm, considering that the powder reflectance is quite consistent with the hue (i.e. the density) of red of the pigment-attached red-emitting phosphor.

③ The amount of the remaining ZnS was calculated from the $Zn^{2+}$ content obtained by dissolving the reclaimed phosphor with a strong acid completely and determining $Zn^{2+}$. This value corresponds to the total amount of the blue- and green-emitting phosphors remaining in the red-emitting phosphor. The larger the amount of the remaining ZnS, the smaller the value x in x/y, and this indicates that the peak of the fluorescence emitted by the red-emitting phosphor was shifted to the short wavelength side.

④ The visually observed UV-stimulated color mixture was measured by coating the red-phosphor on a transparent glass plate by means of an alcohol and stimulating it by ultraviolet light, whereupon the number of specks of blue- and green-emitting phosphors existing in a field of view of an optical microscope, was counted. It corresponds to the amount of the remaining ZnS.

⑤ The amount of the remaining SBR binder was analyzed by pyrolysis gas chromatography, and calculated based on the value of the fresh red-emitting phosphor being evaluated to be 100%. A decrease of the remaining SBR binder which attaches the pigment to the phosphor, indicates exfoliation of the pigment.

the remaining SBR binder was substantial, and exfoliation of the pigment and the considerable reduction of luminance, were observed, although ZnS was sufficiently removed. The reduction of luminance seems to result from partial oxidization of the surface of the $Y_2O_2S$:Eu phosphor by the oxidizing agent.

With respect to Sample E, which was treated with a treating solution comprising NaOH and NaClO, the removal of ZnS proceeded considerably as compared with Sample C, but the decrease in the amount of the remaining SBR binder was substantial, which indicates exfoliation of the pigment.

With respect to Sample F, an example treated by the method of the present invention, namely treated with a treating solution comprising NaOH, $H_2O_2$ and NaClO, ZnS was sufficiently removed, the amount of the remaining SBR binder was similar to that in Sample B of fresh phosphor, no exfoliation of the pigment or no shift of the x/y value was observed, and the luminance was as high as that of Sample B.

According to the present invention, by adopting the above construction, it is possible not only to prevent the pigment from exfoliation but also to completely remove blue- and green-emitting phosphors contained as contaminants in the recovered red-emitting phosphor, and the recovered red-emitting phosphor can be reclaimed effectively to obtain a red-emitting phosphor with high luminance and a good coating property.

We claim:

1. A method for reclaiming a pigment-attached red-emitting phosphor recovered from a manufacturing process for a color picture tube, which comprises:
   (i) contacting a slurry containing said pigment-attached red-emitting phosphor with: water, 0.3 to 4.0% by weight, based on the solid content of the phospher slurry to be treated, of NaOH, 1.0 to 5.0% by weight, based on the solid content of the phospher slurry to be treated, of NaClO, and 0.5 to 3.0% by weight, based on the solid content of the

TABLE 1

| Samples | Treating conditions | Characteristics of red-emitting phosphor | | Powder reflectance (500 nm) | Amount of the remaining ZnS (%) | Visually observed UV-stimulated color mixture | Amount of the remaining SBR binder (%) |
|---|---|---|---|---|---|---|---|
| | | x/y | Luminance (%) | | | | |
| A | Recovered phosphor washed with water | 0.657/0.332 | 101 | 58.6% | 0.34 | 10 | 100 |
| B | Fresh red-emitting phosphor slurry | 0.663/0.334 | 100 | 52.0% | 0.000 | 0 | 100 |
| C | NaOH (0.5%) + $H_2O_2$ (1.4%) | 0.660/0.334 | 102 | 61.7% | 0.04 | 10 | 79 |
| D | NaOH (10%) + $H_2O_2$ (14%) | 0.663/0.334 | 83 | 62.0% | 0.001 | 0 | 72 |
| E | NaOH (0.5%) + NaClO (3%) | 0.662/0.334 | 104 | 61.3% | 0.003 | 0 | 81 |
| F | NaOH (0.5%) + NaClO (3%) + $H_2O_2$ (1.4%) | 0.663/0.334 | 100 | 56.7% | 0.000 | 0 | 100 |

Note:
Sample F represents the phosphor reclaimed by the method of the present invention.

Among Samples C and D, which were treated with a treating solution comprising NaOH and $H_2O_2$, sample C had a large amount of remaining ZnS because of a lower concentration of $H_2O_2$, and ten specks of ZnS, which is a host material of blue- and green-emitting phosphors, were observed by the visual observation of the UV-stimulated color mixture. Further, exfoliation of the pigment was confirmed by a decrease of the remaining SBR binder.

With respect to Sample D treated with an increased concentration of $H_2O_2$, the decrease in the amount of phosphor slurry to be treated, of $H_2O_2$, to produce a mixture;
   (ii) subsequently treating said mixture with a weak acid; and
   (iii) recovering said pigment-attached red-emitting phosphor.

2. The method according to claim 1, wherein the pigment is attached to the red-emitting phosphor by a synthetic rubber as a binder.

3. The method according to claim 2, wherein said synthetic rubber is an acrylic resin or a styrene-butadiene resin.

4. The method according to claim 1, wherein said color picture tube contains a red-emitting phosphor or a red iron oxide-attached europium-activated yttrium oxide red-emitting phosphor, and blue- and green-emitting phosphors of which host materials are ZnS.

5. The method according to claim 1, wherein the weak acid is dilute sulfuric acid, dilute hydrochloric acid or acetic acid.

6. The method according to claim 1, wherein the treatment with the weak acid is conducted at a pH of from 2 to 3, followed by washing with water to a pH of at least 4.

* * * * *